United States Patent
Jiang et al.

(10) Patent No.: US 9,275,912 B1
(45) Date of Patent: *Mar. 1, 2016

(54) METHOD FOR QUANTIFICATION OF EXTENDED DEFECTS IN GALLIUM-CONTAINING NITRIDE CRYSTALS

(71) Applicant: SORAA, INC., Fremont, CA (US)

(72) Inventors: Wenkan Jiang, Corona, CA (US); Dirk Ehrentraut, Santa Barbara, CA (US); Bradley C. Downey, Santa Barbara, CA (US); Mark P. D'Evelyn, Santa Barbara, CA (US)

(73) Assignee: Soraa, Inc., Fremont, CA (US)

( * ) Notice: Subject to any disclaimer, the term of this patent is extended or adjusted under 35 U.S.C. 154(b) by 148 days.

This patent is subject to a terminal disclaimer.

(21) Appl. No.: 14/013,753

(22) Filed: Aug. 29, 2013

Related U.S. Application Data (60) Provisional application No. 61/695,270, filed on Aug. 30, 2012.

(51) Int. Cl.
*H01L 29/04* (2006.01)
*H01L 31/036* (2006.01)
*H01L 33/16* (2010.01)
*H01L 21/66* (2006.01)

(52) U.S. Cl.
CPC ...................................... *H01L 22/12* (2013.01)

(58) Field of Classification Search
USPC .................................. 438/488, 705; 428/220
See application file for complete search history.

(56) References Cited

U.S. PATENT DOCUMENTS

| | | | |
|---|---|---|---|
| 4,030,966 A | 6/1977 | Hornig et al. |
| 4,066,868 A | 1/1978 | Witkin et al. |
| 4,350,560 A | 9/1982 | Helgeland et al. |
| 4,870,045 A | 9/1989 | Gasper et al. |
| 5,098,673 A | 3/1992 | Engel et al. |
| 5,169,486 A | 12/1992 | Young et al. |

(Continued)

FOREIGN PATENT DOCUMENTS

| | | |
|---|---|---|
| CN | 101061570 | 10/2007 |
| JP | 2005-289797 | 10/2005 |

(Continued)

OTHER PUBLICATIONS

Altoukhov et al., 'High reflectivity airgap distributed Bragg reflectors realized by wet etching of AlInN sacrificial layers', Applied Physics Letters, vol. 95, 2009, pp. 191102-1-191102-3.

(Continued)

*Primary Examiner* — Pamela E Perkins
(74) *Attorney, Agent, or Firm* — Saul Ewing LLP (57) ABSTRACT

Methods for quantifying extended defects in a gallium-containing nitride crystal, wafer, or device, are disclosed. The methods include providing a gallium-containing nitride crystal, wafer, or device, processing the gallium-containing nitride crystal, wafer, or device in an etchant solution comprising one or more of $H_3PO_4$, $H_3PO_4$ that has been conditioned by prolonged heat treatment to form polyphosphoric acid, and $H_2SO_4$; removing the gallium-containing nitride crystal, wafer, or device from the etchant solution; and quantifying the concentration of at least one of etch pits or etch grooves.

20 Claims, 4 Drawing Sheets

---

Providing a gallium-containing nitride crystal, wafer, or device, wherein the crystal, wafer, or device comprises gallium and nitrogen, has a wurtzite crystal structure, and comprises a surface having a crystallographic orientation that is miscut from {10-10} m-plane by between about -60 degrees and about +60 degrees toward [0001] +c-direction and by up to about 10 degrees toward an orthogonal <1-210> a-direction

↓

Preparing an etchant solution comprising one or more of $H_3PO_4$, $H_3PO_4$ that has been conditioned by prolonged heat treatment to form polyphosphoric acid, and $H_2SO_4$

↓

Processing the gallium-containing nitride crystal, wafer, or device in the etchant solution at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers

(56) References Cited

U.S. PATENT DOCUMENTS

| | | | |
|---|---|---|---|
| 6,129,900 A | 10/2000 | Satoh et al. | |
| 6,273,948 B1 | 8/2001 | Porowski et al. | |
| 6,398,867 B1 | 6/2002 | D'Evelyn et al. | |
| 6,406,540 B1 | 6/2002 | Harris et al. | |
| 6,528,427 B2 | 3/2003 | Chebi et al. | |
| 6,596,079 B1 | 7/2003 | Vaudo et al. | |
| 6,656,615 B2 | 12/2003 | Dwilinski et al. | |
| 6,686,608 B1 | 2/2004 | Takahira | |
| 6,764,297 B2 | 7/2004 | Godwin et al. | |
| 6,765,240 B2 | 7/2004 | Tischler et al. | |
| 6,784,463 B2 | 8/2004 | Camras et al. | |
| 6,787,814 B2 | 9/2004 | Udagawa | |
| 6,861,130 B2 | 3/2005 | D'Evelyn et al. | |
| 6,887,144 B2 | 5/2005 | D'Evelyn et al. | |
| 7,001,577 B2 | 2/2006 | Zimmerman et al. | |
| 7,026,756 B2 | 4/2006 | Shimizu et al. | |
| 7,053,413 B2 | 5/2006 | D'Evelyn et al. | |
| 7,063,741 B2 | 6/2006 | D'Evelyn et al. | |
| 7,078,731 B2 | 7/2006 | D'Evelyn et al. | |
| 7,098,487 B2 | 8/2006 | D'Evelyn et al. | |
| 7,112,829 B2 | 9/2006 | Picard et al. | |
| 7,119,372 B2 | 10/2006 | Stokes et al. | |
| 7,125,453 B2 | 10/2006 | D'Evelyn et al. | |
| 7,160,531 B1 | 1/2007 | Jacques et al. | |
| 7,170,095 B2 | 1/2007 | Vaudo et al. | |
| 7,175,704 B2 | 2/2007 | D'Evelyn et al. | |
| 7,198,671 B2 | 4/2007 | Ueda | |
| 7,252,712 B2 | 8/2007 | Dwilinski et al. | |
| 7,279,040 B1 | 10/2007 | Wang | |
| 7,316,746 B2 | 1/2008 | D'Evelyn et al. | |
| 7,368,015 B2 | 5/2008 | D'Evelyn et al. | |
| 7,381,391 B2 | 6/2008 | Spencer et al. | |
| 7,420,261 B2 | 9/2008 | Dwilinski et al. | |
| 7,470,938 B2 | 12/2008 | Lee et al. | |
| 7,569,206 B2 | 8/2009 | Spencer et al. | |
| 7,625,446 B2 | 12/2009 | D'Evelyn et al. | |
| 7,642,122 B2 | 1/2010 | Tysoe et al. | |
| 7,704,324 B2 | 4/2010 | D'Evelyn et al. | |
| 7,705,276 B2 | 4/2010 | Giddings et al. | |
| 7,759,710 B1 | 7/2010 | Chiu et al. | |
| 7,976,630 B2 | 7/2011 | Poblenz et al. | |
| 8,021,481 B2 | 9/2011 | D'Evelyn | |
| 8,048,225 B2 | 11/2011 | Poblenz et al. | |
| 8,097,081 B2 | 1/2012 | D'Evelyn | |
| 8,148,180 B2 | 4/2012 | Felker et al. | |
| 8,148,801 B2 | 4/2012 | D'Evelyn | |
| 8,278,656 B2 | 10/2012 | Mattmann et al. | |
| 8,303,710 B2 | 11/2012 | D'Evelyn | |
| 8,306,081 B1 | 11/2012 | Schmidt et al. | |
| 8,313,964 B2 | 11/2012 | Sharma et al. | |
| 8,323,405 B2 | 12/2012 | D'Evelyn | |
| 8,329,511 B2 | 12/2012 | D'Evelyn | |
| 8,354,679 B1 | 1/2013 | D'Evelyn et al. | |
| 8,430,958 B2 | 4/2013 | D'Evelyn | |
| 8,435,347 B2 | 5/2013 | D'Evelyn et al. | |
| 8,444,765 B2 | 5/2013 | D'Evelyn | |
| 8,461,071 B2 | 6/2013 | D'Evelyn | |
| 8,465,588 B2 | 6/2013 | Poblenz et al. | |
| 8,482,104 B2 | 7/2013 | D'Evelyn et al. | |
| 8,492,185 B1 | 7/2013 | D'Evelyn et al. | |
| 8,802,471 B1 | 8/2014 | Cich et al. | |
| 2001/0011935 A1 | 8/2001 | Lee et al. | |
| 2002/0155691 A1 | 10/2002 | Lee et al. | |
| 2002/0189532 A1 | 12/2002 | Motoki et al. | |
| 2003/0027014 A1 | 2/2003 | Johnson et al. | |
| 2003/0080345 A1* | 5/2003 | Motoki et al. | 257/103 |
| 2003/0127041 A1 | 7/2003 | Xu et al. | |
| 2003/0128041 A1 | 7/2003 | Byrd | |
| 2003/0138732 A1 | 7/2003 | Nagase | |
| 2003/0140845 A1 | 7/2003 | D'Evelyn et al. | |
| 2003/0145784 A1 | 8/2003 | Thompson et al. | |
| 2003/0183155 A1 | 10/2003 | D'Evelyn et al. | |
| 2003/0209191 A1 | 11/2003 | Purdy | |
| 2003/0232512 A1 | 12/2003 | Dickinson et al. | |
| 2004/0000266 A1 | 1/2004 | D'Evelyn et al. | |
| 2004/0023427 A1 | 2/2004 | Chua et al. | |
| 2005/0087753 A1 | 4/2005 | D'Evelyn et al. | |
| 2005/0098095 A1 | 5/2005 | D'Evelyn et al. | |
| 2005/0128469 A1 | 6/2005 | Hall et al. | |
| 2005/0152820 A1 | 7/2005 | D'Evelyn et al. | |
| 2005/0205215 A1 | 9/2005 | Giddings et al. | |
| 2006/0032428 A1 | 2/2006 | Dwilinski et al. | |
| 2006/0033119 A1* | 2/2006 | Shibata | 257/103 |
| 2006/0037529 A1 | 2/2006 | D'Evelyn et al. | |
| 2006/0037530 A1 | 2/2006 | Dwilinski et al. | |
| 2006/0048699 A1 | 3/2006 | D'Evelyn et al. | |
| 2006/0096521 A1 | 5/2006 | D'Evelyn et al. | |
| 2006/0124051 A1 | 6/2006 | Yoshioka et al. | |
| 2006/0177362 A1 | 8/2006 | D'Evelyn et al. | |
| 2006/0207497 A1 | 9/2006 | D'Evelyn et al. | |
| 2006/0288927 A1 | 12/2006 | Chodelka et al. | |
| 2007/0057337 A1 | 3/2007 | Kano et al. | |
| 2007/0105351 A1 | 5/2007 | Motoki et al. | |
| 2007/0141819 A1 | 6/2007 | Park et al. | |
| 2007/0142204 A1 | 6/2007 | Park et al. | |
| 2007/0151509 A1 | 7/2007 | Park et al. | |
| 2007/0158785 A1 | 7/2007 | D'Evelyn et al. | |
| 2007/0178039 A1 | 8/2007 | D'Evelyn et al. | |
| 2007/0181056 A1 | 8/2007 | D'Evelyn et al. | |
| 2007/0197004 A1 | 8/2007 | Dadgar et al. | |
| 2007/0210074 A1 | 9/2007 | Maurer et al. | |
| 2007/0215033 A1 | 9/2007 | Imaeda et al. | |
| 2007/0218703 A1 | 9/2007 | Kaeding et al. | |
| 2007/0231978 A1 | 10/2007 | Kanamoto et al. | |
| 2007/0252164 A1 | 11/2007 | Zhong et al. | |
| 2007/0264733 A1 | 11/2007 | Choi et al. | |
| 2007/0274359 A1 | 11/2007 | Takeuchi et al. | |
| 2008/0006831 A1 | 1/2008 | Ng | |
| 2008/0025360 A1 | 1/2008 | Eichler et al. | |
| 2008/0056984 A1 | 3/2008 | Yoshioka et al. | |
| 2008/0083741 A1 | 4/2008 | Giddings et al. | |
| 2008/0083970 A1 | 4/2008 | Kamber et al. | |
| 2008/0087919 A1 | 4/2008 | Tysoe et al. | |
| 2008/0096470 A1 | 4/2008 | Hou et al. | |
| 2008/0156254 A1 | 7/2008 | Dwilinski et al. | |
| 2008/0193363 A1 | 8/2008 | Tsuji | |
| 2009/0092536 A1 | 4/2009 | Kawabata et al. | |
| 2009/0140287 A1 | 6/2009 | Fujiwara et al. | |
| 2009/0218593 A1 | 9/2009 | Kamikawa et al. | |
| 2009/0250686 A1 | 10/2009 | Sato et al. | |
| 2009/0301387 A1 | 12/2009 | D'Evelyn | |
| 2009/0301388 A1 | 12/2009 | D'Evelyn | |
| 2009/0309105 A1 | 12/2009 | Letts et al. | |
| 2009/0309110 A1 | 12/2009 | Raring et al. | |
| 2009/0320745 A1 | 12/2009 | D'Evelyn et al. | |
| 2010/0001300 A1 | 1/2010 | Raring et al. | |
| 2010/0003492 A1 | 1/2010 | D'Evelyn | |
| 2010/0003942 A1 | 1/2010 | Ikeda et al. | |
| 2010/0025656 A1 | 2/2010 | Raring et al. | |
| 2010/0031872 A1 | 2/2010 | D'Evelyn | |
| 2010/0031873 A1 | 2/2010 | D'Evelyn | |
| 2010/0031874 A1 | 2/2010 | D'Evelyn | |
| 2010/0031875 A1 | 2/2010 | D'Evelyn | |
| 2010/0031876 A1 | 2/2010 | D'Evelyn | |
| 2010/0075175 A1 | 3/2010 | Poblenz et al. | |
| 2010/0104495 A1 | 4/2010 | Kawabata et al. | |
| 2010/0108985 A1 | 5/2010 | Chung et al. | |
| 2010/0109126 A1 | 5/2010 | Arena | |
| 2010/0147210 A1 | 6/2010 | D'Evelyn | |
| 2010/0151194 A1 | 6/2010 | D'Evelyn | |
| 2010/0189981 A1 | 7/2010 | Poblenz et al. | |
| 2010/0243988 A1 | 9/2010 | Kamikawa et al. | |
| 2011/0062415 A1 | 3/2011 | Ohta et al. | |
| 2011/0064103 A1 | 3/2011 | Ohta et al. | |
| 2011/0100291 A1 | 5/2011 | D'Evelyn | |
| 2011/0101400 A1 | 5/2011 | Chu et al. | |
| 2011/0101414 A1 | 5/2011 | Thompson et al. | |
| 2011/0124139 A1 | 5/2011 | Chang | |
| 2011/0158275 A1 | 6/2011 | Yoshizumi et al. | |
| 2011/0183498 A1 | 7/2011 | D'Evelyn | |
| 2011/0186860 A1 | 8/2011 | Enya et al. | |
| 2011/0212603 A1* | 9/2011 | Arena et al. | 438/478 |
| 2011/0220912 A1 | 9/2011 | D'Evelyn | |
| 2011/0256693 A1 | 10/2011 | D'Evelyn et al. | |

(56) References Cited

U.S. PATENT DOCUMENTS

| | | |
|---|---|---|
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0305934 A1* | 12/2012 | Fudeta .......................... 257/76 |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |
| 2013/0251615 A1 | 9/2013 | D'Evelyn et al. |
| 2013/0323490 A1 | 12/2013 | D'Evelyn et al. |
| 2014/0034961 A1* | 2/2014 | Fujikane et al. ................ 257/76 |
| 2014/0050244 A1 | 2/2014 | Ohno et al. |
| 2014/0065360 A1* | 3/2014 | D'Evelyn et al. ............ 428/141 |
| 2014/0147650 A1 | 5/2014 | Jiang et al. |

FOREIGN PATENT DOCUMENTS

| | | |
|---|---|---|
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2011/044554 | 4/2011 |
| WO | WO 2012/016033 | 2/2012 |

OTHER PUBLICATIONS

Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Choi et al., '2.51 microcavity InGaN light-emitting diodes fabricated by a selective dry-etch thinning process', Applied Physics Letters, 2007, 91(6), 061120.
Copel et al., 'Surfactants in Epitaxial Growth', Physical Review Letters, Aug. 7, 1989, vol. 63, No. 6, p. 632-635.
D'Evelyn et al., 'Bulk GaN Crystal Growth by the High-Pressure Ammonothermal Method', Journal of Crystal Growth, vol. 300, 2007, pp. 11-16.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of Bulk GaN Crystals and Nonpolar/Semipolar Substrates by HVPE', MRS Bulletin, May 2009, vol. 34, No. 5, pp. 313-317.
Fukuda et al., 'Prospects for the Ammonothermal Growth of Large GaN Crystal', Journal of Crystal Growth, vol. 305, 2007, pp. 304-310.
Gladkov et al., 'Effect of Fe doping on optical properties of freestanding semi-insulating HVPE GaN:Fe', Journal of Crystal Growth, 2010, 312, pp. 1205-1209.
Grzegory, 'High pressure growth of bulk GaN from Solutions in gallium', Journal of Physics Condensed Matter, vol. 13, 2001, pp. 6875-6892.
Lide et al., 'Thermal Conductivity of Ceramics and Other Insulating Materials', CRC Handbook of Chemistry and Physics, 91st Edition, 2010-2011, pp. 12-203 and 12-204.
Lu et al., 'Structure of the CI-passivated GaAs(111) surface', Physical Review B, Nov. 15, 1998, vol. 58, No. 20, pp. 13820-13823.
Massies et al., 'Surfactant mediated epitaxial growth of InxGa1—xAs on GaAs (001)', Applied Physics Letters, vol. 61, No. 1, Jul. 6, 1992, pp. 99-101.

http://www.matbase.com/material/non-ferrous-metals/other/molybdenum/properties, Data Table for: Non-Ferrous Metals: Other Metals: Molybdenum, Mar. 28, 2011, pp. 1.
Moutanabbir, 'Bulk GaN Ion Cleaving', Journal of Electronic Materials, vol. 39, 2010, pp. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report & Written Opinion of PCT Application No. PCT/US2009/067745, dated Feb. 5, 2010, 9 pages total.
Porowski, 'High Resistivity GaN Single Crystalline Substrates', Acta Physica Polonica A, vol. 92, No. 2, 1997, pp. 958-962.
Porowski, 'Near Defect Free GaN Substrates', Journal of Nitride Semiconductor, 1999, pp. 1-11.
Sarva et al., 'Dynamic Compressive Strength of Silicon Carbide Under Uniaxial Compression', Material Sciences and Engineering, vol. A317, 2001, pp. 140-144.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Sumiya et al., 'High-pressure synthesis of high-purity diamond crystal', Diamond and Related Materials, 1996, vol. 5, pp. 1359-1365.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Communication from the Polish Patent Office re P394857 dated Jan. 22, 2013.
Communication from the Polish Patent Office re P394857 dated Aug. 14, 2013, 2 pages.
Wang et al., 'Ammonothermal Growth of GaN Crystals in Alkaline Solutions', Journal of Crystal Growth, vol. 287, 2006, pp. 376-380.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
USPTO Office Action for U.S. Appl. No. 12/133,364 dated Nov. 26, 2010, 6 pages.
USPTO Office Action for U.S. Appl. No. 12/133,364 dated Jun. 1, 2011, 7 pages.
USPTO Notice of Allowance for U.S. Appl. No. 12/133,364 dated Oct. 11, 2011, 5 pages.
USPTO Office Action for U.S. Appl. No. 12/133,365 dated Jun. 9, 2011, 17 pages.
USPTO Office Action for U.S. Appl. No. 12/133,365 dated Oct. 18, 2011, 22 pages.
USPTO Office Action for U.S. Appl. No. 12/133,365 dated May 13, 2013, 23 pages.
USPTO Office Action for U.S. Appl. No. 12/133,365 dated Aug. 21, 2013, 29 pages.
USPTO Office Action for U.S. Appl. No. 12/334,418 dated Apr. 5, 2011, 20 pages.
USPTO Office Action for U.S. Appl. No. 12/334,418 dated Oct. 19, 2011, 24 pages.
USPTO Office Action for U.S. Appl. No. 12/334,418 dated Sep. 17, 2013, 27 pages.
USPTO Office Action for U.S. Appl. No. 12/478,736 dated Sep. 27, 2011, 11 pages.
USPTO Office Action for U.S. Appl. No. 12/478,736 dated Feb. 7, 2012, 6 pages.
USPTO Notice of Allowance for U.S. Appl. No. 12/478,736 dated Apr. 23, 2012, 8 pages.
USPTO Notice of Allowance for U.S. Appl. No. 12/478,736 dated Oct. 9, 2012, 4 pages.
USPTO Office Action for U.S. Appl. No. 12/484,095 dated Nov. 10, 2010, 9 pages.
USPTO Office Action for U.S. Appl. No. 12/484,095 dated Jul. 8, 2011, 12 pages.

(56) References Cited

OTHER PUBLICATIONS

USPTO Office Action for U.S. Appl. No. 12/497,969 dated Feb. 2, 2012, 20 pages.
USPTO Office Action for U.S. Appl. No. 12/497,969 dated Jul. 5, 2012, 18 pages.
USPTO Office Action for U.S. Appl. No. 12/497,969 dated May 16, 2013, 22 pages.
USPTO Office Action for U.S. Appl. No. 12/497,969 dated Sep. 6, 2013, 21 pages.
USPTO Office Action for U.S. Appl. No. 12/534,843 dated Sep. 10, 2012, 10 pages.
USPTO Notice of Allowance for U.S. Appl. No. 12/534,843 dated Jan. 24, 2013, 9 pages.
USPTO Office Action for U.S. Appl. No. 12/534,844 dated Sep. 16, 2010, 8 pages.
USPTO Office Action for U.S. Appl. No. 12/534,844 dated Feb. 4, 2011, 9 pages.
USPTO Notice of Allowance for U.S. Appl. No. 12/534,849 dated Jul. 31, 2012, 12 pages.
USPTO Office Action for U.S. Appl. No. 12/534,857 dated Sep. 1, 2010, 13 pages.
USPTO Notice of Allowance for U.S. Appl. No. 12/534,857 dated May 27, 2011, 5 pages.
USPTO Office Action for U.S. Appl. No. 12/546,458 dated Jul. 20, 2011, 5 pages.
USPTO Notice of Allowance for U.S. Appl. No. 12/546,458 dated Nov. 28, 2011, 5 pages.
USPTO Office Action for U.S. Appl. No. 12/556,558 dated Sep. 16, 2010, 8 pages.
USPTO Notice of Allowance for U.S. Appl. No. 12/556,558 dated Mar. 22, 2011, 5 pages.
USPTO Office Action for U.S. Appl. No. 12/556,562 dated Sep. 15, 2010, 7 pages.
USPTO Office Action for U.S. Appl. No. 12/556,562 dated Mar. 21, 2011, 5 pages.
USPTO Notice of Allowance for U.S. Appl. No. 12/556,562 dated Jul. 27, 2011, 5 pages.
USPTO Office Action for U.S. Appl. No. 12/569,337 dated May 9, 2012, 19 pages.
USPTO Notice of Allowance for U.S. Appl. No. 12/569,337 dated Nov. 15, 2012, 5 pages.
USPTO Office Action for U.S. Appl. No. 12/569,844 dated Oct. 12, 2012, 12 pages.
USPTO Office Action for U.S. Appl. No. 12/634,665 dated Apr. 25, 2012, 11 pages.
USPTO Office Action for U.S. Appl. No. 12/634,665 dated Oct. 1, 2012, 10 pages.
USPTO Notice of Allowance for U.S. Appl. No. 12/634,665 dated Feb. 15, 2013, 9 pages.
USPTO Office Action for U.S. Appl. No. 12/636,683 dated Jun. 12, 2013, 15 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 12/724,983 dated Mar. 5, 2012, 21 pages.
USPTO Office Action for U.S. Appl. No. 12/785,404 dated Mar. 6, 2012, 10 pages.
USPTO Notice of Allowance for U.S. Appl. No. 12/785,404 dated Jul. 16, 2012, 5 pages.
USPTO Office Action for U.S. Appl. No. 12/891,668 dated Sep. 25, 2012, 21 pages.
USPTO Office Action for U.S. Appl. No. 12/891,668 dated Jan. 10, 2013, 31 pages.
USPTO Notice of Allowance for U.S. Appl. No. 12/891,668 dated Mar. 20, 2013, 14 pages.
USPTO Office Action for U.S. Appl. No. 13/025,833 dated Jul. 12, 2012, 16 pages.
USPTO Office Action for U.S. Appl. No. 13/041,199 dated Nov. 30, 2012, 14 pages.
USPTO Office Action for U.S. Appl. No. 13/041,199 dated Mar. 12, 2013, 10 pages.
USPTO Office Action for U.S. Appl. No. 13/175,739 dated Dec. 7, 2012, 6 pages.
USPTO Notice of Allowance for U.S. Appl. No. 13/175,739 dated Mar. 21, 2013, 6 pages.
USPTO Office Action for U.S. Appl. No. 13/179,346 dated Dec. 13, 2012, 24 pages.
USPTO Office Action for U.S. Appl. No. 13/226,249 dated Oct. 10, 2012, 7 pages.
USPTO Notice of Allowance for U.S. Appl. No. 13/226,249 dated Feb. 21, 2013, 5 pages.
USPTO Office Action for U.S. Appl. No. 13/272,981 dated Mar. 20, 2013, 19 pages.
USPTO Office Action for U.S. Appl. No. 13/272,981 dated Aug. 15, 2013, 13 pages.
USPTO Office Action for U.S. Appl. No. 13/346,507 dated Dec. 21, 2012, 9 pages.
USPTO Notice of Allowance for U.S. Appl. No. 13/346,507 dated Apr. 22, 2013, 8 pages.
USPTO Notice of Allowance for U.S. Appl. No. 13/425,304 dated Aug. 22, 2012, 9 pages.
USPTO Notice of Allowance for U.S. Appl. No. 13/548,931 dated Jun. 3, 2013, 11 pages.
Aguilar, 'Ohmic n-contacts to Gallium Nitride Light Emitting Diodes', National Nanotechnologhy Infrastructure Network, 2007, p. 56-81.
Lu et al., 'Etch-Pits of GaN Films with Different Etching Methods', Journal of the Korean Physical Society, vol. 45, Dec. 2004, p. S673-S675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
USPTO Office Action for U.S. Appl. No. 13/723,968 dated Nov. 29, 2013 (23 pages).
USPTO Notice of Allowance for U.S. Appl. No. 13/723,968 dated Apr. 28, 2014 (8 pages).
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
USPTO Office Action for U.S. Appl. No. 13/472,356 dated Dec. 9, 2013 (11 pages).
USPTO Office Action for U.S. Appl. No. 13/600,191 dated Mar. 11, 2015 (9 pages).

\* cited by examiner

Providing a gallium-containing nitride crystal, wafer, or device, wherein the crystal, wafer, or device comprises gallium and nitrogen, has a wurtzite crystal structure, and comprises a surface having a crystallographic orientation that is miscut from {10-10} m-plane by between about -60 degrees and about +60 degrees toward [0001] +c-direction and by up to about 10 degrees toward an orthogonal <1-210> a-direction Preparing an etchant solution comprising one or more of $H_3PO_4$, $H_3PO_4$ that has been conditioned by prolonged heat treatment to form polyphosphoric acid, and $H_2SO_4$ Processing the gallium-containing nitride crystal, wafer, or device in the etchant solution at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers

FIG. 1

Removing the gallium-containing nitride crystal, wafer, or device from the etchant solution

FIG. 2

Quantifying the concentrations of etch pits and etch grooves

METHOD FOR QUANTIFICATION OF EXTENDED DEFECTS IN GALLIUM-CONTAINING NITRIDE CRYSTALS

RELATED APPLICATIONS

The present application claims the benefit under 35 U.S.C. §119(e) of U.S. Provisional Application No. 61/695,270 filed on Aug. 30, 2012, which is incorporated by reference in entirety.

GOVERNMENT LICENSE RIGHTS

This invention was made with government support under Grant IIP-1026896, awarded by the U.S. National Science Foundation. The government has certain rights in the invention.

BACKGROUND

This disclosure relates generally to techniques for processing materials for manufacture of gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth method of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area c-plane gallium nitride crystals, typically with a (0001) orientation. The large-area c-plane gallium nitride crystals generally come in 2 inch diameter, free-standing (0001) GaN substrates and are generally available commercially. However, for certain applications other crystallographic orientations may be used.

There has been considerable interest in GaN-based devices fabricated on nonpolar and semipolar crystallographic orientations for at least a decade. Much of this interest derives from the reduction or elimination of piezoelectric and strain-related electric fields that can be very large in conventional c-plane GaN-based devices. However, cost-effective manufacturing of devices generally requires relatively large area substrates, for example, larger than 2", 4", or 6". Efforts to grow such substrates heteroepitaxially has generally produced large concentrations of stacking faults, a particular type of extended defect, at least $10^3$-$10^5$ cm$^{-1}$ or even larger. In addition, very low concentrations of threading dislocations are highly desirable, for example, for laser diode lifetimes, and heteroepitaxy of nonpolar or semipolar GaN wafers generally produces dislocation densities of $10^8$-$10^{11}$ cm$^{-2}$. Methods for homoepitaxial growth of nonpolar and semipolar wafers are known, for example, growth of thick c-plane boules by HVPE or ammonothermally following by slicing at a transverse or oblique angle with respect to the growth direction, but it is difficult to make large area wafers by such methods.

In addition, metrology of both threading dislocations and stacking faults presents some challenges. Characterization of high-dislocation and/or high-stacking-fault GaN material, for example, grown heteroepitaxially by hydride vapor phase epitaxy (HVPE), has generally relied on transmission electron microscopy (TEM) or photoluminescence (PL). However, TEM, because of the small sampled area, has insufficient sensitivity to quantify dislocation densities below about $10^8$ cm$^{-2}$ or stacking fault concentrations below about $10^3$ cm$^{-1}$, and Luminescence-based methods such as PL and CL rely heavily on the relative intensity of the band-edge emission peak, which may be too low in GaN grown by ammonothermal techniques for reliable detection and quantification of dislocations or stacking faults.

From the above, it can be appreciated that techniques for improving crystal growth and crystal characterization are highly desirable.

SUMMARY

According to the present disclosure, techniques related to techniques for processing materials for manufacture of gallium based substrates are provided.

One embodiment comprises a method for quantifying extended defects in a gallium-containing nitride crystal, wafer, or device. The method commences by providing a gallium-containing nitride crystal, wafer, or device, wherein the crystal, wafer, or device comprises gallium and nitrogen, has a wurtzite crystal structure, and comprises a first surface having a crystallographic orientation that is miscut from a {10-10} m-plane by between about 0.01 degree and about 60 degrees toward a [000-1] –c-direction and by up to about 10 degrees toward an orthogonal <1-210> a-direction, preparing an etchant composition, processing the gallium-containing nitride crystal, wafer, or device in the etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, removing the gallium-containing nitride crystal, wafer, or device from the etchant composition, and quantifying the concentration of etch pits (or quantifying a concentration of etch grooves).

In some other exemplary embodiments, methods of quantification are performed on a (0001) +c-plane surface, and such methods may further comprise preparing a vicinal m-plane surface on the gallium-containing nitride crystal, wafer, or device, the vicinal m-plane surface having a crystallographic orientation that is miscut from a {10-10} m-plane by between about 0.05 degree and about 5 degrees toward a [000-1] –c-direction and by up to about 5 degrees toward an orthogonal <1-210> a-direction, preparing a second etchant composition, processing the gallium-containing nitride crystal gallium-containing nitride crystal, wafer, or device in the second etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers on the m-plane surface, removing the gallium-containing nitride crystal gallium-containing nitride crystal, wafer, or device from the second etchant composition, and quantifying the concentration of etch pits (or quantifying a concentration of etch grooves).

A further understanding of the nature and advantages of the present disclosure may be realized by reference to the specification and attached drawings.

DETAILED DESCRIPTION

According to the present disclosure, techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

D'Evelyn and co-inventors, in U.S. Application Publication No. 2011/0256693, incorporated by reference in its entirety, taught methods for growing gallium nitride crystals. However, these inventors may not have been aware of issues associated with the formation and detection of stacking faults in ammonothermally-grown GaN and the negative device performance implications of the presence of stacking faults. Consequently, we have discovered improved methods for detecting of extended defects in ammonothermally-grown gallium-containing nitride crystals and for synthesis of large area, high quality bulk gallium-containing nitride crystals, including crystals and wafers with nonpolar or semipolar orientations.

We have discovered that that threading dislocations and stacking faults can be reliably detected and quantified in both HVPE GaN and ammonothermal GaN of a range of crystallographic orientations by etching of polished surfaces in phosphoric acid ($H_3PO_4$) or its mixtures with sulfuric ($H_2SO_4$) acid, or in molten NaOH/KOH, at temperatures above about 100 to 200 degrees Celsius provided the crystallographic orientation is precisely controlled within certain limits. Threading dislocations and stacking faults can also be detected and quantified, albeit with less precision, on as-grown surfaces. Both threading dislocations and stacking faults can also be reliably detected by deposition of InGaN-containing quantum well structures on a polished GaN substrate and performing PL or CL characterization of the quantum well emission. Dislocations can be quantified by deposition of Schottky contacts and performing electron beam induced current (EBIC) imaging, but reliable detection of stacking faults by EBIC appears to be very difficult. For at least ammonothermal GaN, neither CL, PL, or X-ray diffraction appear to be capable of reliably quantifying dislocation densities below about $10^5$ $cm^{-2}$ or stacking fault concentrations below about $10^2$ $cm^{-1}$.

Using the aforementioned etching metrology, we find that ammonothermal GaN growth grown in on nonpolar and/or semipolar directions, that is, laterally with respect to c-direction growth, often produces crystalline GaN material with stacking fault concentrations of the order of $10^2$ $cm^{-1}$, even when no stacking faults can be detected in the seed crystal.

Dislocations in GaN are known to act as strong non-radiative recombination centers which can severely limit the efficiency of GaN-based LEDs and laser diodes (Speck and Rosner, *Physica B: Condensed Matter*, 273-274(0), 24-32 (1999); Jiang et al., *Physica status solidi (b)*, 244(8), 2878-2891 (2007); and Yonenaga et al., *Journal of Crystal Growth*, 318(1), 415-417 (2011)). Non-radiative recombination generates local heating which may lead to faster device degradation (Cao et al., *Microelectronics Reliability*, 43(12), 1987-1991 (2003)). In high-power applications, GaN-based devices suffer from decreased efficiency with increasing current density, known as droop. There is evidence suggesting a correlation between dislocation density and the magnitude of droop in LEDs (Schubert et al., *Applied Physics Letters*, 91(23), 231114 (2007)). For GaN-based laser diodes there is a well-documented negative correlation between dislocation density and mean time to failure (MTTF) (Tomiya et al., *IEEE Journal of Selected Topics in Quantum Electronics*, 10(6), 1277-1286 (2004)), which appears to be due to impurity diffusion along the dislocations (Orita et al., *IEEE International Reliability Physics Symposium Proceedings* (pp. 736-740 (2009)). For electronic devices, dislocations have been shown to markedly degrade the leakage current (Kaun et al., *Applied Physics Express*, 4(2), 024101 (2011)) and the device lifetime (Tapajna et al., *Applied Physics Letters*, 99(22), 223501-223503 (2011)) in HEMT structures. One of the primary advantages of using bulk GaN as a substrate material for epitaxial thin film growth is the greatly reduced threading dislocations in the film. Therefore, the dislocation density in the bulk GaN substrate will have a significant impact on the device efficiency and the reliability and it is very important to have good metrology for it. Such methodology is much better developed for c-plane HVPE GaN than it is for nonpolar, semipolar, and/or ammonothermal GaN.

Cathodoluminescence (CL) is a widely-used technique to map the dislocation density in HVPE GaN over large areas. However, in ammonothermally grown GaN the CL spectrum may be dominated by broad blue and/or yellow luminescence peaks with relatively little band-edge emission and little or no contrast at dislocations, at room temperature and, we find, at liquid nitrogen temperature.

Selective wet chemical etching is another widely used technique to reveal threading dislocations in c-plane GaN (Kamler et al., *The European Physical Journal Applied Physics*, 27(1-3), 247-249 (2002); Kozawa et al., *Journal of The Electrochemical Society*, 143(1), L17-L19 (1996); Lu et al., Journal of Applied Physics, 104(12), 123525 (2008); Shiojima et al., Journal of Vacuum Science & Technology B: Microelectronics and Nanometer Structures, 18(June 1999), 37-40 (2000); and Xu et al., Journal of Electronic Materials, 31(5), 402-405 (2002)). Few papers exist regarding the proper etching conditions for the m-plane surface (Stocker et al., Physica status solidi (c), 8(7-8), 2113-2116 (1998); Wei et al., Japanese Journal of Applied Physics, 47, 3346 (2008)). For example, Swider and co-workers reported that no etch pits were formed on m-plane surfaces prepared from ammonothermally-grown bulk GaN crystals, despite formation of copious etch pits on c-plane surfaces (Swider et al., Physica status solidi (c), 8(7-8), 2113-2116 (2011)). We found that acid treatment conditions severe enough to form etch pits on m-plane surfaces may cause massive destruction of other surfaces, e.g., the (000-1) or N face. We discovered, surprisingly, an extreme sensitivity of the etching behavior of surfaces vicinal to m-plane and of semipolar surfaces, with very different behavior on surfaces miscut from m-plane toward −c-plane versus miscut toward +c-plane. Based on our findings, the failure of Swider et al. to observe any etch pits on m-plane surfaces may have been a consequence of these surfaces having a slight miscut toward the +c-plane which, surprisingly, are remarkably resistant to pit formation during etching treatments.

Another technique that can be applied to quantify dislocation density is electron channeling contrast imaging (ECCI) microscopy (Kamaladasa et al., Journal of Microscopy, 244(3), 311-319 (2011); Picard et al., Applied Physics Letters, 91(9), 094106 (2007)); and Picard and Kamaladasa, Microscopy: Science, Technology, Applications and Education, 1583 (2008)), which uses a small area backscattered diode detector in a scanning electron microscope (SEM). At low magnification, collection of backscattered electrons over a large angular width is obtained by rastering the incoming electron beam, obtaining a Kikuchi diffraction pattern. By centering the beam onto a particular Kikuchi band (representing a particular set of atomic planes) and bringing the sample into high magnification, a single diffraction condition is isolated. A structural defect such as a dislocation locally distorts the atomic planes, altering the backscattered electron signal and giving rise to contrast, even at off-peak-diffraction orientations. We found that the dislocation distribution imaged by ECCI on HVPE GaN agrees very well with that obtained from standard CL mapping, except that ECCI has markedly higher resolution (~50 nm versus ~2 μm for CL). We also find that ECCI is able to reliably detect threading dislocations on nonpolar and semipolar ammonothermal GaN crystals and wafers.

We have been able to identify etch conditions with mixtures of $H_2SO_4$ and $H_3PO_4$ or of NaOH and KOH for defect-selective etching of c-plane, vicinal m-plane, and certain semipolar planes of HVPE and SCoRA GaN. This technique can be applied to as-grown bulk GaN boules and also to polished GaN crystals or wafers. The −c N face can be heavily etched under conditions that provide good defect-selective etching of the m-plane, but wrapping the −c N end or face of a crystal with Teflon, clamping the −c N end or face of a crystal against Teflon, or painting with Teflon tape can protect it against massive erosion. In the case of HVPE GaN, we have been able to establish an approximately one-to-one relationship between pit formation and dark spots in CL images, validating the technique.

Quantification of the concentration of threading dislocations at concentrations below about $10^7$ cm$^{-2}$ in c-plane GaN, particularly on the (0001) +c face, appears to be best performed using molten NaOH, KOH, or a NaOH/KOH eutectic melt, with the optional addition of MgO powder, at temperatures between about 170 degrees Celsius and about 500 degrees Celsius for times between about 30 seconds and about five hours (Kamler et al., The European Physical Journal Applied Physics, 27(1-3), 247-249 (2004); Kamler et al., Journal of Crystal Growth, 246(1-2), 21-24 (2002); Shiojima, Journal of Vacuum Science & Technology B: Microelectronics and Nanometer Structures, 18(June 1999), 37-40 (2000); Swider et al., (2011); and Weyher et al., Journal of Crystal Growth, 210(1-3), 151-156 (2000)).

Method development is also desirable for quantification of stacking faults at low concentrations, particularly in m-plane or semipolar GaN. While n-type GaN grown in the c-direction may be free of stacking faults, m-plane growth is often plagued with the generation and expansion of basal plane stacking faults (BSF), often reaching a line density as high as $10^6$ cm$^{-1}$ in heteroepitaxially-grown films (Cho et al., Applied Physics Letters, 93(11), 111904 (2008)); and Hirai et al., Applied Physics Letters, 90(12), 121119 (2007)). The BSFs create an internal electric field along the c-direction whose magnitude is proportional to the BSF density (Kamler et al., The European Physical Journal Applied Physics, 27(1-3), 247-249 (2004)), which can reduce the radiative recombination efficiency of a quantum well (QW). In addition, BSFs cause locally-elevated In uptake, giving rise to red-shifted emission and optical absorption at the nominal emission wavelength, which is particularly deleterious for lasers. A high BSF density in a GaN substrate can also result in QW structures with a very broad or a double peaked emission characteristic (Fischer et al., Applied Physics Express, 2, 041002 (2009)).

The most common type of BSF ($I_1$) has an emission peak at ~3.41 eV above the valence band (Liu et al., Journal of Applied Physics, 104(12), 123525 (2005)); and Rebane et al., Physica status solidi (a), 164(1), 141-144 (1997)), too close to the band-edge emission (3.48 eV) to resolve at room temperature. We have not been able to identify conditions whereby EBIC measurements are able to reliably detect stacking faults. While ECCI is capable in principle of imaging stacking faults, the sample must be polished and oriented to a precise diffraction condition to reveal its contrast. This is because, unlike dislocations, stacking faults do not exhibit strong surface relaxation, and therefore their diffraction contrast is highly sample orientation dependent. We have found, however, that conditions producing good dislocation-selective etching in mixtures of $H_2SO_4$ and $H_3PO_4$ may also reliably produce etched linear features associated with stacking faults on nonpolar and semipolar surfaces. We were able to establish an approximately one-to-one relationship between stacking faults detected by defect-selective etching with those detected by low temperature cathodoluminescence on HVPE substrates, as long as the faulted region is significantly longer than etch pits associated with threading dislocations.

Figure 4A:
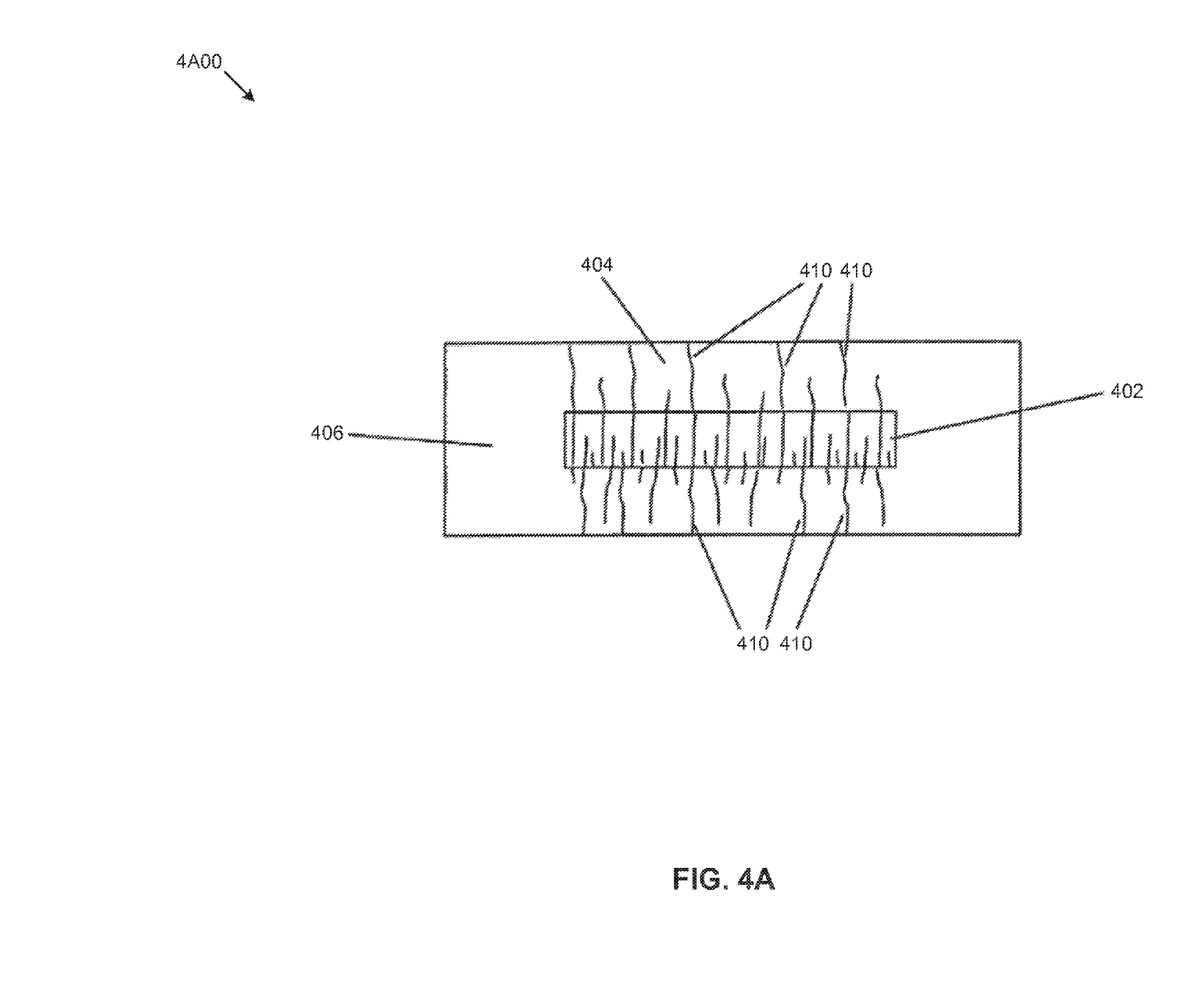
FIG. 4A is a simplified diagram illustrating dislocation propagation during ammonothermal growth according to the prior art.

Referring to FIG. 4A, as described in U.S. Pat. No. 7,078, 731, for example, it has commonly been believed that dislocations 410 in ammonothermally-grown crystals 400 originating from c-plane-grown HVPE seeds 402 propagate in the +c and −c directions during ammonothermal growth but not significantly in lateral growth directions, forming region 406. Regions 404 that are free of dislocations are consequently relatively small. It has also been commonly believed that stacking faults present in a seed crystal will propagate into ammonothermally-grown layers grown upon the seed crystal, but that growth from a stacking-fault-free bulk GaN seed will lead to stacking-fault-free material in ammonothermally-grown layers. We find, surprisingly, that both of these beliefs are incorrect.

Figure 4B:
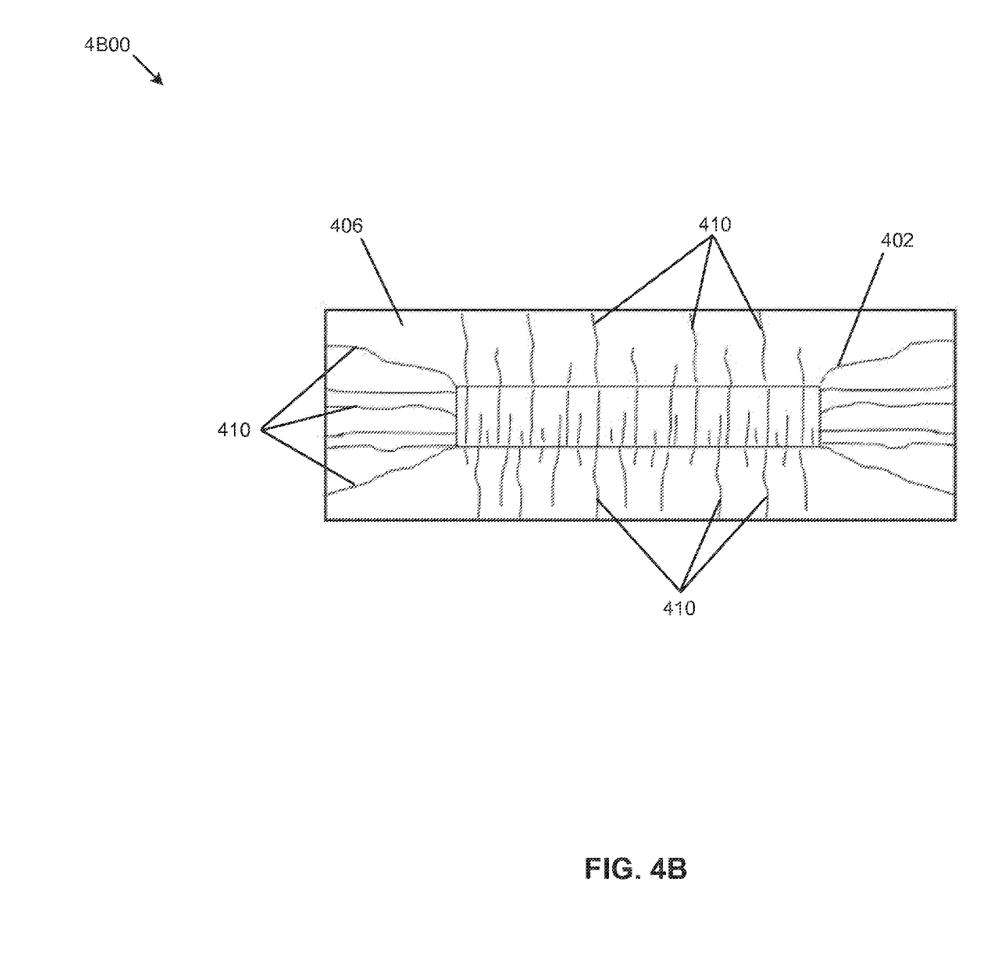
FIG. 4B is a simplified diagram illustrating dislocation propagation during ammonothermal growth according to certain embodiments of the present disclosure.

We find, by contrast, as shown schematically in FIG. 4B, that dislocations 410 can propagate in many directions with respect to seed 402, including both c-plane and m-plane, both vertically and laterally. Region 406, having a reduced dislocation density, has a significantly lower volume than has been realized and, under some conditions, may contain significant concentrations of basal stacking faults.

Figure 5:
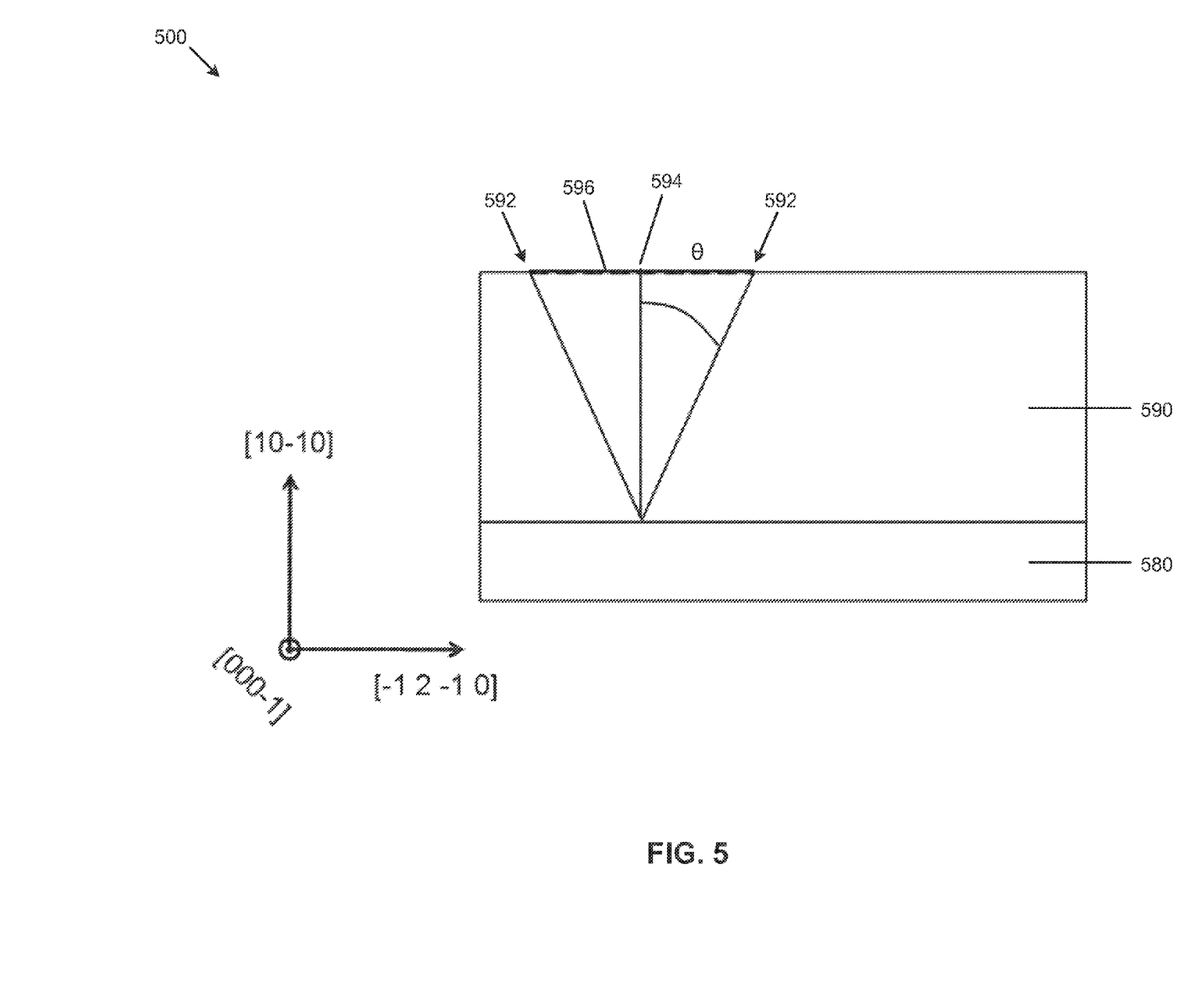
FIG. 5 is a simplified diagram for propagation of basal stacking faults during ammonothermal growth according to certain embodiments of the present disclosure.

We also find, as shown schematically in FIG. 5, that basal stacking faults may form during ammonothermal growth on stacking-fault-free, HVPE-grown seed crystals 580, particularly when that growth occurs in nonpolar or semipolar orientations, as would be desired for formation of large-area nonpolar or semipolar GaN crystals or wafers. Stacking fault 596 in ammonothermally-grown layer 590 is oriented in the a-direction and is terminated by partial dislocations 592 that form a half-angle θ with respect to surface normal 594. Half-angle θ may be between about 0.1 degree and about 30 degrees, or between about 0.4 degree and about 15 degrees. The stacking faults may form as a consequence of residual strain in the seed crystal, a slight lattice mismatch between the seed crystal and the ammonothermally-grown layer, the presence of −c N-face micro- or nanofacets on the surface of the layer during ammonothermal growth, or the like. In certain embodiments the stacking faults form predominantly at or near the interface between the seed crystal and the new ammonothermally-grown layer. In certain embodiments additional stacking faults may nucleate and grow within the ammonthermally-grown layer.

Kamler and co-workers have found that dislocation loops can form during c-plane growth of GaN, with stacking-faulted domains within the loop (Kamler et al., *The European Physical Journal Applied Physics*, 27(1-3), 247-249 (2004)). Similarly, Liliental-Weber and co-workers observed dislocation loops surrounding stacking-faulted domains in bulk GaN crystals of extremely high crystallographic quality (Liliental-Weber et al., *Journal of Electronic Materials*, 25(9), 1545-1550 (1996)). Slicing of such a crystal to expose a nonpolar or semipolar surface may intersect such dislocation loops and give rise to stacking faults on the surface. Consequently, in the absence of data indicating absence of stacking faults in bulk GaN crystals, even bulk GaN crystals grown in the c-direction, one must assume that stacking faults are present.

Figure 1:
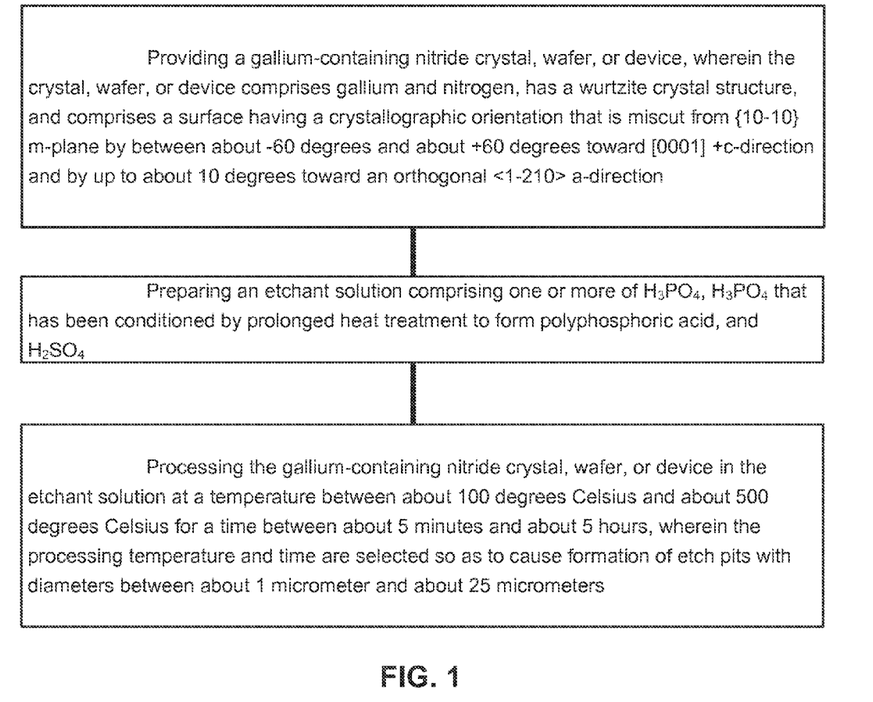
FIGS. 1-3 depict processing steps, according to certain embodiments.
Figure 2:
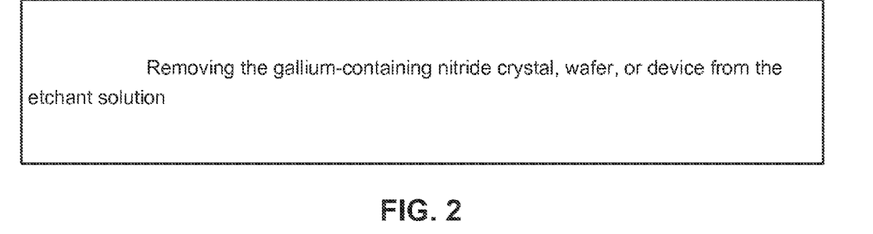
Figure 3:
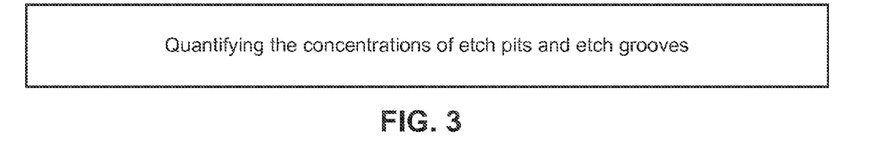

A method for detecting and quantifying extended defects, including threading dislocations and basal stacking faults, in gallium-containing nitride crystals, wafers, or devices, may be outlined as follows:

Provide one or more gallium-containing nitride crystals, wafers, or devices. The crystals may have a maximum dimension between about 0.1 millimeter and about 1000 millimeters. The crystals may have one or more surfaces that are vicinal to m-plane or semipolar and are chosen to be miscut from m-plane toward the [000-1] −c-plane. In certain embodiments, at least one surface has a crystallographic orientation that is miscut from a {10-10} m-plane by between about 0.05 degree and about 60 degrees toward a [000-1] −c-direction and by up to about 10 degrees toward an orthogonal <1-210> a-direction. In certain embodiments, at least one surface has a crystallographic orientation that is miscut from a {10-10} m-plane by between about 0.1 degree, 0.5 degree, or 1 degree and about 60 degrees toward a [000-1] −c-direction and by up to about 10 degrees toward an orthogonal <1-210> a-direction.

Optionally, protect one or more surfaces of a gallium-containing nitride crystal to protect the surface(s) from unwanted attack. For example, a (000-1) −c surface may be protected by tightly wrapping with Teflon tape, clamping the −c N end or face of a crystal against Teflon, or by coating with a Teflon-containing paint and allowing to dry and/or cure. Teflon may be replaced by an alternative etch-resistant material, if desired.

Prepare an etchant composition or solution. In certain embodiments, a solution of 85% phosphoric acid ($H_3PO_4$) and sulfuric ($H_2SO_4$) acids is prepared. The $H_2SO_4/H_3PO_4$ ratio may vary between 0 and about 1:1. In certain embodiments, a phosphoric acid solution is conditioned to form polyphosphoric acid, increasing its boiling point. For example reagent-grade (85%) $H_3PO_4$ may be stirred and heated in a beaker, at a temperature between about 200 degrees Celsius and about 450 degrees Celsius for between about 5 minutes and about five hours. In other embodiments, a mixture of NaOH and KOH is prepared, for example, a 50-50 mole % mixture.

Etch one or more gallium-containing nitride crystals in the etchant composition or solution. The etchant solution may be stirred, and the etching treatment may be performed at a temperature between about 100 degrees Celsius and about 500 degrees Celsius for between about 5 minutes and about 5 hours. Etching should be performed at a high enough temperature, for a long enough time, so that etch pits large enough to be detected reliably are formed on the crystallographic plane(s) of interest. However, the conditions should not be so severe that etch pits substantially overlap one another, or quantification may be difficult. For example, the etch pits may have lateral dimensions between about 1 micrometer and about 25 micrometers. In the case of etching in a melt comprising at least one of NaOH and KOH, the etching may be performed at a temperature between about 170 degrees Celsius and about 500 degrees Celsius for a time between about 30 seconds and about five hours, or at a temperature between about 300 degrees Celsius and about 500 degrees Celsius for a time between about five minutes and about one hour.

Remove one or more gallium-containing nitride crystals from the etchant composition, wash, dry, and examine under a microscope. The etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density. The presence of grooves, with a width similar to that of the etch pits but extended in the <11-20> direction or in a direction within a few degrees of <11-20>, depending on the <11-20> miscut angle of the surface, indicates the presence of stacking faults. The stacking fault concentration within a field of view may be calculated as the sum of the lengths of the stacking-faulted regions divided by the area of the field of view. Improved statistics may be obtained by repeating this measurement in additional fields of view and calculating the average stacking fault density.

The above sequence of steps provides a method according to an embodiment of the present disclosure. Other alternatives can also be provided where steps are added, one or more steps are removed, or one or more steps are provided in a different sequence without departing from the scope of the claims herein.

We find that this treatment, with adjustments made to the etch temperature and/or the etch time to accommodate differences in etch rates between different crystallographic planes, doping levels (Fermi level), etc., works well to detect and quantify etch pits (threading dislocations) and/or etch grooves (basal stacking faults) on surfaces comprising: (i) precisely on-axis {10-10} m-plane or m-plane surfaces that are miscut towards [000-1] and/or toward <11-20> by about 10 degrees or less; (ii) {10-1-1} semi-polar surfaces; and (iii)

{h0–h–1} semipolar surfaces. For example, this treatment works well to quantify threading dislocations and stacking faults in surfaces that are miscut from {10-10} m-plane by between about 60 degrees and about 0.05 degree toward [000-1] –c-direction and by up to about 10 degrees toward an orthogonal <1-210> a-direction, that are miscut from {10-10} m-plane by between about 30 degrees and about 0.05 degree toward [000-1] –c-direction and by up to about 5 degrees toward an orthogonal <1-210> a-direction, that are miscut from {10-10} m-plane by between about 60 degrees and about 0.1 degree toward [000-1] –c-direction and by up to about 10 degrees toward an orthogonal <1-210> a-direction, or that are miscut from {10-10} m-plane by between about 60 degrees and about 0.5 degree toward [000-1] –c-direction and by up to about 10 degrees toward an orthogonal <1-210> a-direction. Surprisingly, we find that, presumably due to heretofore unrealized crystallographic anisotropy in the etch rates, etching of {10-10} surfaces that are miscut toward [0001] +c-plane by more than about 0.1 degree, or more than about 0.5 degree, or of {h0–h+l} semipolar surfaces may not produce any etch pits despite the presence of dislocations and/or stacking faults. We found that etch-characterization of nominally m-plane surfaces was extremely inconsistent until we discovered this surprising anisotropy effect. The impact of this crystallographic-orientation limitation can be minimized by performing etch evaluation of both the front and back surface of m-plane or semi-polar wafers, for example, after polishing and/or chemical-mechanically polishing both surfaces. By treating the front and back surfaces of gallium-containing nitride crystals, wafers, or devices, which may be substantially parallel to one another, simultaneously, therefore, this treatment works well to quantify threading dislocations and stacking faults crystals, wafers, or devices having surfaces that are miscut from {10-10} m-plane by between about −60 degrees and about +60 degrees toward [0001] +c-direction and by up to about 10 degrees toward an orthogonal <1-210> a-direction, that are miscut from {10-10} m-plane by between about −30 degrees and about +30 degree toward [0001] +c-direction and by up to about 5 degrees toward an orthogonal <1-210> a-direction, or that are miscut from {10-10} m-plane by between about −5 degrees and about +5 degree toward [0001] +c-direction and by up to about 1 degree toward an orthogonal <1-210> a-direction.

The extent of the anisotropy between etching of m-plane surfaces miscut towards [000-1] versus [0001], and the anisotropy of the etch pits themselves, may be decreased by increasing the $H_2SO_4/H_3PO_4$ ratio from 0 to between about 1:10 and about 1:1, or to between about 1:5 and about 1:2. However, addition of $H_2SO_4$ to the etchant solution tends to increase the rate of attack of any (000-1) –c surfaces present, increasing the importance of protecting them against exposure to the etchant solution.

For etch-characterization of n-type (doping level between about $1 \times 10^{17}$ cm$^{-3}$ and about $3 \times 10^{18}$ cm$^{-3}$), –c-miscut or precisely on-axis m-plane GaN, we find that etching in stirred, conditioned $H_3PO_4$ in a beaker on a hot plate, at a hot plate temperature of about 350 degrees Celsius, for a time between about 30 minutes and about 60 minutes, works well. The conditioned $H_3PO_4$ may be prepared by heating reagent-grade (85%) $H_3PO_4$ in a beaker, stirred at about 70 revolutions per minute, at a hot plate temperature of approximately 450 degrees Celsius for about one hour. Etch pits associated with threading dislocations on m-plane GaN may be rectangular, with four facets meeting at a vertex in approximately the center of the pit. As the degree of miscut toward [000-1] increases, the etch pits tend to elongate in the a-direction and the facets become less distinct and more rounded. The pits may be approximately 2-3 micrometers long along the ±c direction and about 1 micrometer long along the a direction and about 100 nanometers deep. Etch grooves, associated with stacking faults on m-plane GaN may have a width of about 2-4 micrometers in the ±c direction, a length between about 5 micrometers up to about 1 millimeter or even longer, and a depth of about 100 nanometers. Of course, etching at higher temperatures and/or longer times will tend to produce larger, deeper pits, while etching at lower temperatures and/or shorter times will tend to produce smaller, shallower pits. To a good approximation, the lengths of the etch grooves associated with stacking faults is independent of the etching conditions.

In certain embodiments, the surface to be etch-characterized has been polished and chemical-mechanically polished. In certain embodiments, the surface to be etch-characterized is in the as-grown state. Detection and quantification of threading dislocations and basal stacking faults may be more reliable with polished or chemical-mechanically-polished surfaces. Surprisingly, we find that the reliability of the etch pit and/or etch groove density measurement is improved when the surface being evaluated has been chemical-mechanically polished rather than just mechanically polished.

In cases where a gallium-containing nitride crystal has been grown in the m-direction, the concentration of threading dislocations and/or stacking faults may be determined as a function of depth with respect to the growth surface by etch-characterization of a test surface oriented at a wedge angle between 0.1 and 10 or between 1 and 5 degrees of the m-plane growth surface. For example, a gallium-containing nitride crystal, wafer, or device may be mounted on a fixture having a wedge angle between 0.1 and 10 degrees or between 1 and 5 degrees. The gallium-containing nitride crystal, wafer, or device may then be thinned by lapping or grinding, exposing a test surface that is miscut from the m-plane growth direction by between 0.1 and 10 degrees or between 1 and 5 degrees. The azimuthal orientation of the gallium-containing nitride crystal, wafer, or device on the test fixture is chosen so that the test surface is miscut from m-plane by between 0.1 and 10 degrees toward [00-1] –c-plane and by less than 10 degrees toward <11-20>. The test surface may be polished and/or chemical-mechanically polished prior to performing etch-characterization.

To detect stacking faults in c-plane oriented crystals or wafers, a vicinal m-plane surface may be prepared by cleaving, sawing, grinding, slicing, or the like. The prepared, vicinal m-plane surface may be lapped, polished, and chemical-mechanically polished. The crystal or wafer with the prepared vicinal m-plane surface may then be etched characterized as described above.

A method for detecting and quantifying extended defects, including threading dislocations and basal stacking faults, in near-c-plane-oriented gallium-containing nitride crystals, wafers, or devices, may be outlined as follows:

Provide one or more near-c-plane-oriented gallium-containing nitride crystals, wafers, or devices. The crystals may have a maximum dimension between about 0.1 millimeter and about 1000 millimeters. The (0001) +c-plane surface, or a surface vicinal to it, optionally, may be subjected to one or more of lapping, polishing, and chemical mechanical polishing in order to render the +c-plane surface smooth and specular.

Prepare a first etchant composition comprising one or more of NaOH and KOH. Optionally, MgO powder may be added.

Etch one or more crystals, wafers, or devices in the first etchant composition at a temperature between about 170 degrees Celsius and about 500 degrees Celsius for a time between about 30 seconds and about five hours. Etching should be performed at a high enough temperature, for a long enough time, so that etch pits large enough to be detected reliably are formed on the (0001) +c plane. However, the conditions should not be so severe that etch pits substantially overlap one another, or quantification may be difficult. For example, the etch pits may have lateral dimensions between about 1 micrometer and about 25 micrometers.

Remove one or more gallium-containing nitride crystals, wafers, or devices from the first etchant composition, wash, dry, and examine under a microscope. The c-plane etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density.

Prepare a vicinal m-plane surface on a near-c-plane-oriented gallium-containing nitride crystal, wafer, or device by cleaving, sawing, slicing, or the like. The vicinal m-plane surface may have a surface area of at least about 3 square millimeters and may have a crystallographic orientation that is miscut from a {10-10} m-plane by between about 0.05 degree and about 10 degrees toward a [000-1] –c-direction and by up to about 5 degrees toward an orthogonal <1-210> a-direction. The vicinal m-plane surface, optionally, may be subjected to one or more of lapping, polishing, and chemical mechanical polishing in order to render the m-plane surface smooth and specular.

Optionally, protect one or more surfaces of a gallium-containing nitride crystal, wafer, or device to protect the surface(s) from unwanted attack. For example, a (000-1) –c surface may be protected by tightly wrapping with Teflon tape, clamping the –c N end or face of a crystal against Teflon, or by coating with a Teflon-containing paint and allowing to dry and/or cure. Teflon may be replaced by an alternative etch-resistant material, if desired.

Prepare a second etchant composition. In certain embodiments, a solution of 85% phosphoric acid ($H_3PO_4$) and sulfuric ($H_2SO_4$) acids is prepared. The $H_2SO_4/H_3PO_4$ ratio may vary between 0 and about 1:1. In certain embodiments, a phosphoric acid solution is conditioned to form polyphosphoric acid, increasing its boiling point. For example reagent-grade (85%) $H_3PO_4$ may be stirred and heated in a beaker, at a temperature between about 200 degrees Celsius and about 450 degrees Celsius for between about 5 minutes and about five hours.

Etch one or more gallium-containing nitride crystals, wafers, or devices in the second etchant composition. The etchant solution may be stirred, and the etching treatment may be performed at a temperature between about 100 degrees Celsius and about 500 degrees Celsius for between about 5 minutes and about 5 hours. Etching should be performed at a high enough temperature, for a long enough time, so that etch pits large enough to be detected reliably are formed on the m-plane(s) of interest. However, the conditions should not be so severe that etch pits substantially overlap one another, or quantification may be difficult. For example, the etch pits may have lateral dimensions between about 1 micrometer and about 25 micrometers.

Remove one or more gallium-containing nitride crystals, wafers, or devices from the etchant solution, wash, dry, and examine under a microscope. The vicinal m-plane etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density. The presence of grooves, with a width similar to that of the etch pits but extended in the <11-20> direction or in a direction within about 10 degrees of <11-20>, depending on the <11-20> miscut angle of the surface, indicates the presence of stacking faults in the m-plane. The stacking fault concentration within a field of view may be calculated as the sum of the lengths of the stacking-faulted regions divided by the area of the field of view. Improved statistics may be obtained by repeating this measurement in additional fields of view and calculating the average stacking fault density.

We have also investigated detection of threading dislocations and stacking faults on vicinal m-plane GaN surfaces by etching in molten NaOH/KOH, following Kamler et al. (Kamler et al., *The European Physical Journal Applied Physics*, 27(1-3), 247-249 (2004)). We found, however, that this method has two significant disadvantages relative to etching in $H_3PO_4/H_2SO_4$: (i) the etch pits tend to be broader (higher width/depth ratio), making it more difficult to form pits than can be unambiguously detected without also causing significant overlap between adjacent pits; and (ii) an even more extreme etch anisotropy. We find that pits on m-plane surface mis-oriented by only about 0.1 degree towards [000-1] tend to be highly asymmetric, with clearly defined etch pit boundaries towards [0001] and towards <11-20> but the etch pit boundary towards [000-1] may be difficult to observe. Etching of m-plane surface misoriented by only about 0.1 degree towards [0001] produced no etch pits at all but only formation of macro-steps, whose morphology appeared to be unrelated to the underlying dislocation or stacking fault structure.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A c-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 41.8 grams of polycrystalline GaN nutrient, 2.6 grams of $NH_4F$ mineralizer, and 30.0 grams of ammonia and the capsule was sealed. The capsule was placed in an internally-heated high pressure apparatus and heated to temperatures of approximately 647 degrees Celsius for the upper, nutrient zone and approximately 665 degrees Celsius for the lower, crystal growth zone, maintained at these temperatures for approximately 45 hours, and then cooled and removed. The crystal, which grew to a thickness of approximately 1.6 millimeters, was then examined under a microscope. The crystal was then etched in conditioned $H_3PO_4$ in a beaker, stirred at 130 revolutions per minute, at a hot plate temperature of approximately 350 degrees Celsius for 30 minutes. The conditioned $H_3PO_4$ was prepared by heating 150 milliliters of reagent-grade (85%) $H_3PO_4$ in a beaker, stirred at 70 revolutions per minute, at a hot plate temperature of approximately 450 degrees Celsius for one hour. The etched crystal was then examined under a microscope. The c-plane surface of the a-wings were very smooth, with very few etch pits, indicating a very low dislocation density, in agreement with FIG. 4A and FIG. 4B. However, inspection of the m-plane edges of the crystal revealed an etch pit density of approximately $5 \times 10^5$ cm$^{-2}$ to $1 \times 10^6$ cm$^{-2}$, indicating a significant dislocation density, in agreement with FIG. 4B.

Example 2

An m-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 49.0 grams of polycrystalline GaN nutrient, 2.6 grams of NH$_4$F mineralizer, and 29.2 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The crystal, which grew to a thickness of approximately 1.4 millimeters, was then lapped at an angle of approximately 3.7 degrees to allow for examination of the GaN material properties as a function of thickness above the interface with the HVPE seed crystal, and the freshly prepared surface, mis-oriented by 3.7 degrees from (10-10) toward [000-1], was chemical-mechanically polished. The crystal was then etched in conditioned H$_3$PO$_4$ in a beaker, stirred at 130 revolutions per minute, at a hot plate temperature of approximately 350 degrees Celsius for 60 minutes. The conditioned H$_3$PO$_4$ was prepared by heating 150 milliliters of reagent-grade (85%) H$_3$PO$_4$ in a beaker, stirred at 70 revolutions per minute, at a hot plate temperature of approximately 450 degrees Celsius for one hour. The etched crystal was then examined under a microscope.

The exposed surface of the seed crystal had a dislocation (etch pit) density of approximately $5 \times 10^5$ cm$^{-2}$ and no observable stacking faults. The dislocation (etch pit) density of the ammonothermally-grown layer varied from approximately $2 \times 10^5$ over much of its thickness to a high of approximately $2 \times 10^6$ cm$^{-2}$ at the thickest point above the seed, which occurred near the +c edge of the miscut sample. Since the thickness of the grown layer varies with lateral position above the seed crystal in an experiment such as this, it is possible or likely that the observed variation in dislocation density in the ammonothermally grown layer resulted principally from variations in the dislocation density in the seed crystal as a function of lateral position rather than from a systematic variation in dislocation density with layer thickness.

The stacking fault concentration in the ammonothermally grown layer increased from zero in the seed crystal to about 10 cm$^{-1}$ at a thickness of about 100 micrometers to about 50 cm$^{-1}$ at a thickness of about 400 micrometers. The average length of the faulted regions, which could readily be measured from the length of the linear etch features, increased from about 10 micrometers at a thickness of about 100 micrometers to about 100 micrometers at a thickness of about 400 micrometers. The number density of the stacking faults, without regard to their length, was approximately constant, at about $1.4 \times 10^4$ cm$^{-2}$, throughout the thickness of the ammonothermally grown layer. This constancy indicates that most or all of the stacking faults nucleated near the seed/layer interface and that the length of the stacking faults increased with growth thickness, with the half-angle between the surface normal and the partial dislocations that bound the stacking fault varying between approximately 0.6 degree to about 10 degrees.

Example 3

Two semipolar oriented bulk GaN crystals grown by HVPE, approximately 0.3 millimeters thick, were provided for evaluation of the concentrations of threading dislocations and basal stacking faults. The large-area surfaces of the first crystal had crystallographic orientations within about 0.3 degree of (20-21) and (20-2-1), which are miscut from m-plane by approximately 14.9 degrees toward [0001] +c-plane and toward [000-1] −c-plane, respectively. The large-area surfaces of the second crystal had crystallographic orientations within about 0.3 degree of (10-11) and (10-1-1), which are miscut from m-plane by approximately 28.0 degrees toward [0001] +c-plane and toward [000-1] −c-plane, respectively. The crystals were then etched in conditioned H$_3$PO$_4$ in a beaker, stirred at 130 revolutions per minute, at a hot plate temperature of approximately 350 degrees Celsius for 60 minutes. The conditioned H$_3$PO$_4$ was prepared by heating 150 milliliters of reagent-grade (85%) H$_3$PO$_4$ in a beaker, stirred at 70 revolutions per minute, at a hot plate temperature of approximately 450 degrees Celsius for one hour. The etched crystals were then examined under a microscope.

The exposed surfaces of the crystals that were miscut toward +c-plane, that is, the (20-21) and (10-11) surfaces, were covered by linear microfacets and no distinct etch pits were discernible. By contrast, the exposed surfaces of the crystals that were miscut toward −c-plane, that is, the (20-2-1) and (10-1-1) surfaces, were relatively smooth and distinct etch pits were present. The (20-2-1) surface of the first crystal had a dislocation (etch pit) density of approximately $7.7 \times 10^5$ cm$^{-2}$ and no observable stacking faults. The (10-1-1) surface of the second crystal had a dislocation (etch pit) density of approximately $6.2 \times 10^5$ cm$^{-2}$ and no observable stacking faults.

While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. A method for quantifying extended defects in a gallium-containing nitride crystal, wafer, or device, comprising:
   providing a gallium-containing nitride crystal, wafer, or device, wherein the crystal, wafer, or device comprises gallium and nitrogen, has a wurtzite crystal structure, and comprises a first surface having a crystallographic orientation that is miscut from a {10-10} m-plane by between about 0.01 degrees and about 60 degrees toward a [000-1] −c-direction and by up to about 10 degrees toward an orthogonal <1-210> a-direction;
   preparing an etchant composition;
   processing the gallium-containing nitride crystal, wafer, or device in the etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers;
   removing the gallium-containing nitride crystal, wafer, or device from the etchant composition; and
   quantifying a concentration of at least one of etch pits and etch grooves,
   wherein quantifying the concentration of etch pits is performed by counting a number of the etch pits within a field of view; and quantifying the concentration of etch grooves is performed by calculating a total length of the etch grooves within a field of view.

2. The method of claim 1, wherein the etchant composition comprises one or more of NaOH and KOH.

3. The method of claim 1, wherein the etchant composition comprises a solution of one or more of $H_3PO_4$, $H_3PO_4$ that has been conditioned by prolonged heat treatment to form polyphosphoric acid, and $H_2SO_4$.

4. The method of claim 3, wherein the etchant composition is prepared by conditioning of reagent-grade phosphoric acid to form polyphosphoric acid.

5. The method of claim 1, wherein the first surface has been prepared by chemical-mechanical polishing prior to performing the etch treatment.

6. The method of claim 1, further comprising protecting one or more surfaces of the gallium-containing nitride crystal using one or more of an etch-resistant tape, clamping an end or face of a crystal against an etch-resistant material, and coating with a paint comprising an etch-resistant material.

7. The method of claim 1, further comprising preparing a second surface that is substantially parallel to the first surface, wherein both the first surface and the second surface are chemical-mechanically polished, and processing both the first surface and the second surface in the etchant composition simultaneously.

8. The method of claim 1, wherein the gallium-containing nitride crystal, wafer, or device has been grown in an m-direction, the first surface is miscut from a {10-10} m-plane by between about 1 degree and about 5 degrees toward a [000-1] –c-direction and by up to about 5 degrees toward an orthogonal <1-210> a-direction, and the concentration of at least one of threading dislocations and stacking faults is determined as a function of distance from the m-plane growth surface.

9. The method of claim 1, wherein the first surface has a crystallographic orientation that is miscut from a {10-10} m-plane by between about 0.05 degree and about 60 degrees toward a [000-1] –c-direction and by up to about 10 degrees toward an orthogonal <1-210> a-direction.

10. A method for quantifying extended defects in a gallium-containing nitride crystal, wafer, or device, comprising:
    providing a gallium-containing nitride crystal, wafer, or device, wherein the crystal, wafer, or device comprises gallium and nitrogen, has a wurtzite crystal structure, and comprises a surface having a crystallographic orientation within 5 degrees of a (0001) +c-plane;
    preparing a first etchant composition;
    processing the gallium-containing nitride crystal, wafer, or device in the first etchant composition at a temperature between about 100 degrees Celsius and about 500 degrees Celsius for a time between about 30 seconds and about 5 hours, wherein the processing temperature and time are selected so as to cause formation of etch pits with diameters between about 1 micrometer and about 25 micrometers;
    removing the gallium-containing nitride crystal, wafer, or device from the first etchant composition;
    quantifying a concentration of at least one of etch pits and etch grooves on a (0001) +c-plane surface;
    preparing a vicinal m-plane surface on the gallium-containing nitride crystal, wafer, or device, the vicinal m-plane surface having a crystallographic orientation that is miscut from a {10-10} m-plane by between about 0.01 degree and about 5 degrees toward a [000-1] –c-direction and by up to about 10 degrees toward an orthogonal <1-210> a-direction;
    preparing a second etchant composition;
    processing the gallium-containing nitride crystal gallium-containing nitride crystal, wafer, or device in the second etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers on the vicinal m-plane surface;
    removing the gallium-containing nitride crystal gallium-containing nitride crystal, wafer, or device from the second etchant composition; and
    quantifying a concentration of at least one of etch pits and etch grooves on the vicinal m-plane surface,
    wherein quantifying the concentration of etch pits is performed by counting a number of the etch pits within a field of view; and quantifying the concentration of etch grooves is performed by calculating a total length of the etch grooves within the field of view.

11. The method of claim 10, wherein the first etchant composition comprises one or more of NaOH and KOH and the gallium-containing nitride crystal, wafer, or device is processed in the first etchant composition at a temperature between about 170 degrees Celsius and about 500 degrees Celsius for a time between about five minutes and about five hours.

12. The method of claim 10, wherein the second etchant composition is a solution comprising one or more of $H_3PO_4$, $H_3PO_4$ that has been conditioned by prolonged heat treatment to form polyphosphoric acid, and $H_2SO_4$.

13. The method of claim 12, wherein the second etchant composition is prepared by conditioning of reagent-grade phosphoric acid to form polyphosphoric acid, increasing its boiling point.

14. The method of claim 10, wherein the vicinal m-plane surface has been prepared by chemical-mechanical polishing prior to performing the etch treatment.

15. The method of claim 10, further comprising protecting one or more surfaces of the gallium-containing nitride crystal using one or more of an etch-resistant tape, clamping an end or face of a crystal against an etch-resistant material, and coating with a paint comprising an etch-resistant material.

16. A method for quantifying extended defects in a gallium-containing nitride crystal, wafer, or device, comprising:
    providing a gallium-containing nitride crystal, wafer, or device, wherein the crystal, wafer, or device comprises gallium and nitrogen, has a wurtzite crystal structure, and comprises a surface having a crystallographic orientation that is miscut from a {10-10} m-plane by between about −1 degree and about +60 degrees toward a [000-1] –c-direction and by up to about 10 degrees toward an orthogonal <1-210> a-direction;
    preparing an etchant composition; the etchant composition comprising a solution prepared by conditioning of reagent-grade phosphoric acid to form polyphosphoric acid, increasing its boiling point;
    processing the gallium-containing nitride crystal, wafer, or device in the etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers;
    removing the gallium-containing nitride crystal, wafer, or device from the etchant composition; and
    quantifying a concentration of at least one of etch pits and etch grooves,
    wherein quantifying the concentration of etch pits is performed by counting a number of the etch pits within a field of view; and quantifying the concentration of etch grooves is performed by calculating a total length of the etch grooves within the field of view.

17. The method of claim 16, further comprising protecting one or more surfaces of the gallium-containing nitride crystal using one or more of an etch-resistant tape, clamping an end or face of a crystal against an etch-resistant material, and coating with a paint comprising an etch-resistant material.

18. The method of claim 16, wherein the surface having a crystallographic orientation that is miscut from a {10-10} m-plane by between about −1 degree and about +60 degrees toward a [000-1] −c-direction and by up to about 10 degrees toward an orthogonal <1-210> a-direction has been prepared by chemical-mechanical polishing prior to performing etch treatment.

19. A method for quantifying extended defects in a gallium-containing nitride crystal, wafer, or device, comprising:
providing a gallium-containing nitride crystal, wafer, or device, wherein the crystal, wafer, or device comprises gallium and nitrogen, has a wurtzite crystal structure, and comprises a surface having a crystallographic orientation within 5 degrees of a (0001) +c-plane;
preparing a first etchant composition;
processing the gallium-containing nitride crystal, wafer, or device in the first etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers;
removing the gallium-containing nitride crystal, wafer, or device from the first etchant composition;
quantifying a concentration of at least one of etch pits and etch grooves on a (0001) +c-plane surface;
preparing a vicinal m-plane surface on the gallium-containing nitride crystal, wafer, or device, the vicinal m-plane surface having a crystallographic orientation that is miscut from a {10-10} m-plane by between about 0.05 degree and about 5 degrees toward a [000-1] −c-direction and by up to about 5 degrees toward an orthogonal <1-210> a-direction;
preparing a second etchant composition;
processing the gallium-containing nitride crystal gallium-containing nitride crystal, wafer, or device in the second etchant composition at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers on the vicinal m-plane surface;
removing the gallium-containing nitride crystal gallium-containing nitride crystal, wafer, or device from the second etchant composition; and
quantifying the concentrations of at least one of etch pits and etch grooves on the vicinal m-plane surface,
wherein quantifying the concentration of etch pits is performed by counting a number of the etch pits within a field of view; and quantifying the concentration of etch grooves is performed by calculating a total length of the etch grooves within the field of view.

20. The method of claim 19, wherein the vicinal m-plane surface has been prepared by chemical-mechanical polishing prior to performing the etch treatment.

\* \* \* \* \*